US007711533B2

(12) United States Patent
Wilensky et al.

(10) Patent No.: US 7,711,533 B2
(45) Date of Patent: May 4, 2010

(54) DISTRIBUTED AGENT NETWORK USING OBJECT BASED PARALLEL MODELING LANGUAGE TO DYNAMICALLY MODEL AGENT ACTIVITIES

(76) Inventors: Uri Wilensky, 734 Arbor La., Glenview, IL (US) 60025; Walter M. Stroup, 1383 S. 1400 East, Salt Lake City, UT (US) 84105

(\*) Notice: Subject to any disclaimer, the term of this patent is extended or adjusted under 35 U.S.C. 154(b) by 2577 days.

(21) Appl. No.: 10/016,192

(22) Filed: Dec. 12, 2001

(65) Prior Publication Data
US 2002/0138242 A1 Sep. 26, 2002

Related U.S. Application Data

(60) Provisional application No. 60/255,537, filed on Dec. 12, 2000.

(51) Int. Cl.
*G06F 17/50* (2006.01)
*G06F 9/45* (2006.01)
(52) U.S. Cl. .......................................... 703/13; 703/22
(58) Field of Classification Search .................... 703/13
See application file for complete search history.

(56) References Cited

U.S. PATENT DOCUMENTS

| 5,333,286 | A | \* | 7/1994 | Weinberger et al. | ........... 714/47 |
| 5,466,200 | A | \* | 11/1995 | Ulrich et al. | .................... 482/4 |
| 6,332,130 | B1 | \* | 12/2001 | Notani et al. | ................. 705/28 |
| 6,405,135 | B1 | \* | 6/2002 | Adriany et al. | ................. 702/5 |
| 6,449,739 | B1 | \* | 9/2002 | Landan | ......................... 714/47 |
| 2002/0022952 | A1 | \* | 2/2002 | Zager et al. | .................... 703/22 |

OTHER PUBLICATIONS

U. Wilensky, "Modeling Emergent Phenomena with StarLogoT," http://www.ccl.sesp.northwestern.edu/papers/modelemerg/ModelingEmergentData.html, @CONCORD.org, Winter 2000, 16 pages.
U. Wilensky et al., "GasLab—an Extensible Modeling Toolkit for Exploring Statistical Mechanics," http://www.ccl.sesp.northwestern.edu/papers/eurologo, Proceedings of the Seventh Annual European Logo Conference EUROLOGO 99, Sofia, Bulgaria, (1999) 10 pages.
U. Wilensky, "Networked Gridlock: Students Enacting Complex Dynamic Phenomena with the HubNet Architecture," Proceedings of the Fourth Annual International Conference of the Learning Sciences, Ann Arbor, MI, Jun. 14-17, 2000, 9 pages.

(Continued)

*Primary Examiner*—Kamini S Shah
*Assistant Examiner*—David Silver
(74) *Attorney, Agent, or Firm*—Hamilton & Terrile, LLP; Michael Rocco Cannatti

(57) ABSTRACT

A distributed network of interactive agents is provided wherein remote agents interact with a central computer and with one another through an object based parallel modeling language and/or an aggregate modeling language using an open client-server architecture, which enables many users to control the behavior of individual objects or agents and to view the aggregated results on a central computer. This network of agents is integrated with a powerful suite of modeling, analysis and display tools that together give agents the capacity to "fly" the system in intuitive mode, to reflect on the emergent result of their simulation and, also, to encode their strategies as rules which the system can then run independently.

13 Claims, 6 Drawing Sheets

OTHER PUBLICATIONS

U. Wilensky, et al., "Participatory Simulations Project: Networked-based Design for Systems Learning—NSF: Title: Parallelism and Emergent Activities in a Classroom Network—A Collaborative Match," 1999, 13 pages.

U. Wilensky et al., "Participatory Simulations Project," http://www.ccl.tufts.edu/ps/, 22 pages.

* cited by examiner

DISTRIBUTED AGENT NETWORK USING OBJECT BASED PARALLEL MODELING LANGUAGE TO DYNAMICALLY MODEL AGENT ACTIVITIES

CROSS-REFERENCE TO RELATED APPLICATIONS

The present case claims the benefit of U.S. Provisional Application Ser. No. 60/255,537 entitled "Distributed Agent Network Using Object Based Parallel Modeling Language To Dynamically Model Agent Activities," filed Dec. 12, 2000.

BACKGROUND

1. Technical Field

The present invention relates to the field of computer systems. In one aspect, the present invention relates to a network-based architecture for enabling individual agents to interactively model and simulate complex dynamic systems. The present invention can be beneficially applied in many applications, including enabling participatory simulations of complex dynamic systems to model emergent activities of the system.

2. Description of Related Art

Conventional participatory simulations are simulations whereby individual agents act out the roles of individual system elements and then see how the behavior of the system as a whole emerges from these individual behaviors. The emergent behavior of the system and its relation to individual participant actions and strategies can then become the object of collective discussion and analysis.

An early example of a participatory simulation that was used in the context of systems dynamics and systems learning was The Beer Game as developed by Jay Forrester and his systems dynamics group at MIT in the early 1960's. The game does much to highlight the ways in which costly unintended behaviors of a system (in this case beer inventory in a distribution system) can emerge from participants attempting to act rationally in their localized role (e.g., as beer retailer, wholesaler, distributor, or producer). A number of other participatory simulation applications were developed at this time, an example of which was FishBanks (Meadows, 1986), that was developed as an "interactive, role-playing simulation in which groups are asked to manage a fishing company." In FishBanks, students try to maximize their assets in a world with renewable natural resources and economic competition. These programs are examples of an aggregate modeling approach to participatory simulation.

More recently, new classes of so-called "object-based" simulation activities have been developed (Resnick & Wilensky, 1993; 1998; Wilensky & Resnick, 1995). In these so-called "StarPeople" activities, participants typically play the role of "ants" in an anthill simulation, moving around the room and exchanging "messages." After participating in these StarPeople activities, students observe the emergence of global patterns from their local interactions. These pattern become the objects of reflection and discussion.

Throughout much of the history of participatory simulations, computational technologies have played a central role. For example, a class of computational "flight simulators" were developed at MIT to be used by individuals and groups of managers to gain experience flying a complex dynamic system like a modern business. More recently, multi-player networked versions of the beer game have been implemented (Coakley et al, 1995) and it is now even possible to immerse oneself in a multi-player versions of the game on the Internet (Powersim Corporation, 1998). A multi-player calculator-based version of the beer game participatory simulation also has been implemented and used with both school-aged and adult learners (Wilensky & Stroup, 1998, 1999). Management trainers have argued that there is a need for a tighter coupling between computer simulations and user experience. In possibly the first known use of the term participatory simulations, Diehl (1990) constructed systems that gave users more control over and participation within the simulations by allowing users to input more real word decisions and view output of familiar reports. These simulations were modeled using "aggregate" finite-difference tools like STELLA.

In contrast to the "aggregate" finite-difference computer modeling tools used to analyze simulations like The Beer Game, object-based parallel computer modeling languages (OBPML), such as StarLogo and StarLogoT (Resnick, 1994; Wilensky, 1995; 1997b), have previously been developed. For example, Borovoy, Colella and fellow researchers at MIT (Colella et al, 1998; Borovoy et al, 1996; 1998) have developed wearable computational badges (or "thinking tags") that allow users to move freely while communicating information between badges. Colella (1998) developed, implemented and researched student learning with one of the first instances of a participatory simulation supported by a thin layer of computing technology. Disease propagation models have been implemented by a number of researchers and curriculum developers (Colella et al, 1998; Stor & Briggs, 1998).

Further limitations and disadvantages of conventional systems will become apparent to one of skill in the art after reviewing the remainder of the present application with reference to the drawings and detailed description which follow.

SUMMARY OF THE INVENTION

A significant innovation in the present invention has been the provision of complementary use of the two fundamental kinds of dynamical systems modeling—aggregate and object-based approaches. Provision of a modeling system requires careful attention to the relationships between macro- and micro-levels of understanding a system, to thinking in levels, to systems thinking and to the analysis of systems like gases. Through the use of participatory simulations and attention to the kinds of constructs learners articulate and extend in relation to both the aggregate and object-based modeling environment, the present invention provides an improved mechanism that allows these distinct but inter-related forms of analyses to interact and complete one another.

Complexity is the study of systems in which phenomena exhibit complex behavior, the growth of a snowflake crystal, the perimeter pattern of a maple leaf, the dynamics of the Dow Jones or of a fourth grade classroom. These are all systems which can be modeled as composed of many distributed but interacting parts. They all exhibit nonlinear or emergent qualities. Such complex systems can be modeled and analyzed using the object-based parallel modeling language (OBPML) aspect of the present invention. OBPMLs afford a probabilistic and statistical approach to modeling which, in a distributed network embodiment of the present invention, can provide an improved method and system for simulating complex and dynamic systems The present invention provides the capability to author networked activities, and in a selected embodiment, also provides an authoring capability for both modeling and simulation through use of a higher level language, such as N-Logo. For example, by providing a parallel modeling, interface and scripting design language, both modeling and simulation authoring are enabled.

DETAILED DESCRIPTION OF DRAWINGS

Figure 1:
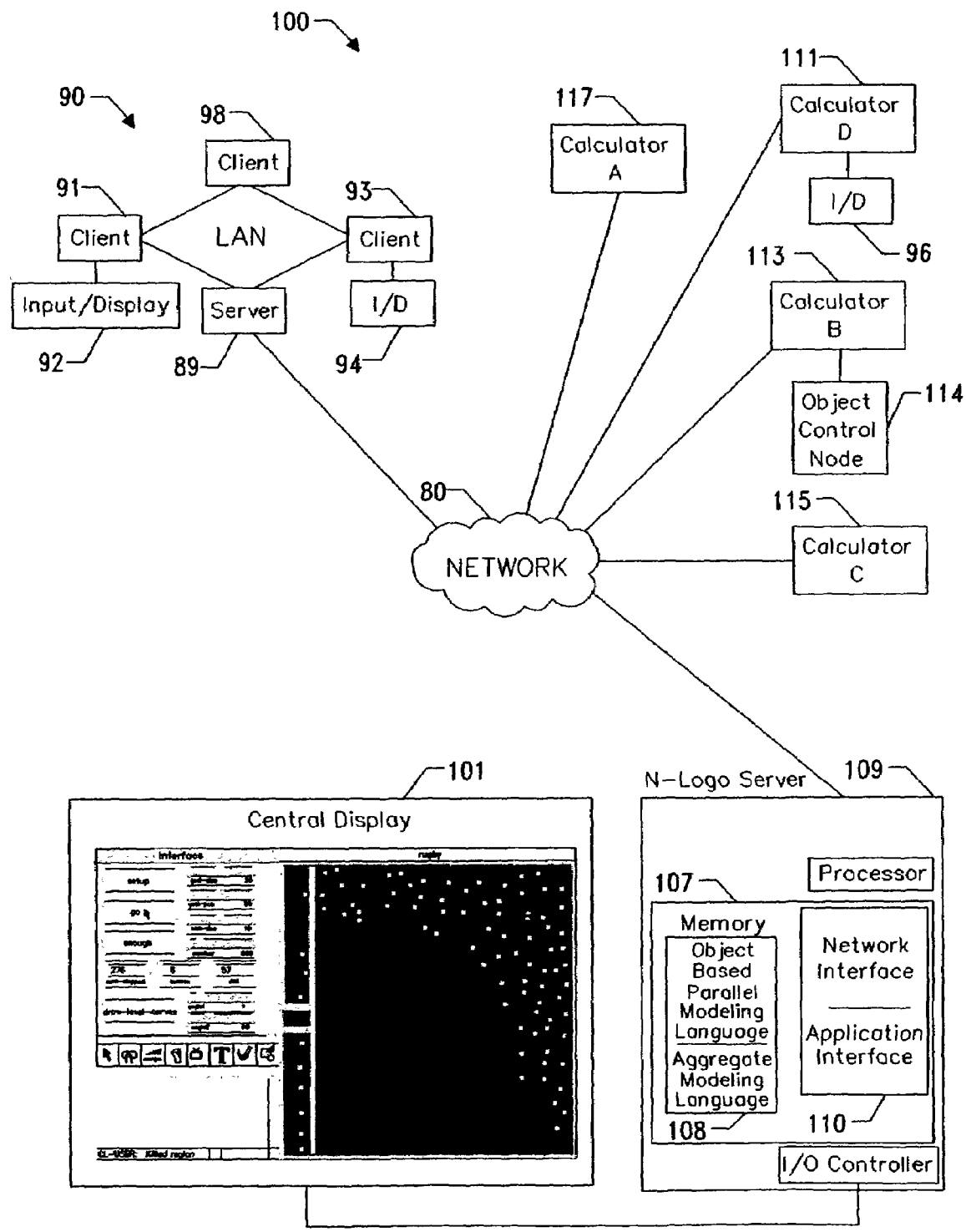
FIG. 1 is an exemplary embodiment of a network of remote devices and a central server system illustrating a distributed simulation system according to the present invention that coordinates remote inputs at the server to efficiently simulate a complex system of remote and independent inputs.

FIG. 1 illustrates an exemplary embodiment of the present invention 100 wherein multiple input devices (here shown as calculator devices 111, 113, 115, 117 and client machines 91, 93, 98) are in communication with a centralized server 109 which processes inputs received from the devices in conjunction with an object-based parallel modeling language component to enable the coordinated and interactive simulation of a complex and dynamic system comprised of inputs from the multiple remote devices. In the embodiment shown in FIG. 1, each remote device (for example, calculator B 113) represents and controls an individual object as a component in the overall system being simulated. Information specific to the particular object being controlled is stored at the remote device 113 as object control node information 114. An example of such object control node information includes position related information for the object in a simulation of the physical interaction between multiple objects in a given space.

In accordance with a selected embodiment, the server 109 of the present invention may be implemented using a MacOS computer with a PowerPC processor, an Apple Guide system software extension and at least 14 megabytes of available RAM.

As shown in FIG. 1, each of the remote devices 111, 113 can be connected together through a network 80 to the centralized server 109, where it will be understood that such connections can include traditional computer hardwire connections, connections through an intranet or internet network, any of a variety of wireless networking technologies, and will also include a direct connection with the server device. As also illustrated in FIG. 1, the present invention can be used in connection with remote client devices 91, 93, 98, which are themselves connected through a local area network 90, server 89, which in turn is directly or indirectly in communication with the server 109. While the remote object devices can be connected in any of a variety of ways to a centralized server device, in a selected embodiment of the present invention, individual hardware client devices (such as calculators, CBL/CBRs or other input devices) communicate with the centralized server device using a standard network communication protocol (such as the TCI/IP protocol).

At the central server 109, the inputs from the various remote devices are collected and aggregated together using modeling, analysis and display tools that together are used to simulate in real time the complex interplay between the individual nodes or objects controlled by the remote devices. By providing an object-based parallel modeling language 108 at the server 109, users at the remote "nodes" can readily encode individualized strategies as rules which the system can then run independently of the other nodes, while simultaneously determining the resulting interplay between the various nodes and broadcasting the result to all remote devices. In a selected embodiment, the object-based parallel modeling language is an enhanced port of the StarLogoT modeling language that enables users to build object-based models of systems consisting of thousands of distributed elements.

By centrally locating the modeling, analysis and display tools at the server 109, the aggregated results of the individual objects' behavior (controlled by the remote device inputs) can be efficiently simulated, thereby avoiding the complexity and time delays associated with distributing such functionality amongst the remote devices. In a selected embodiment, the remote devices are relatively "thin" or "light" in terms of software functionality, containing at least the capability to detect and transmit input information (which can include input data and rules) at a high level, and also display or otherwise communicate information relating to the performance of the individual object and/or its relationship in the system as a whole. For example, the remote device can be a graphing calculator wherein visual information is depicted on the display 96. In the example of simulating multiple objects within a given physical space, each remote device may include a display of where the object associated with that device is located within the physical space, and may also include additional information indicating where all other objects within the system are located. In addition, or in the alternative, a centrally located display 101 shows position information for all objects that are being simulated. Regardless of whether the aggregated object information is displayed (whether at a central display 101 or at the remote display devices 92, 94, 96), the actual assimilation of object data into a single display is accomplished at the central server site 109, and then broadcast, if necessary, to the remote devices, thereby improving speed of the simulation and reducing the computational complexity of having the assimilation and display functionality distributed across plural remote devices.

By providing an object based parallel modeling language at the central server location, a selected embodiment of the present invention enables the remote devices to efficiently and readily implement individualized control input for each object in the form of strategies or rules, and then to readily simulate the combined effect of the various inputs, strategies and rules from the distributed objects into a single simulation.

The computation needs required for providing a real time simulation of interaction between multiple independent objects would traditionally be implemented using parallel computing techniques wherein a supercomputer assigns a separate processor chip to each object, or alternatively, could be emulated on a single computing machine in the form of a program with specified inputs. The present invention presents in one aspect an advance over such conventional approaches by emulating the parallel computer approach with a single central computer and plural distributed remote computing devices, where the central computer assimilates input data, rules and strategy inputs from the remote computing devices, each of which represents a single independent object or "node" in the system.

Figure 2:
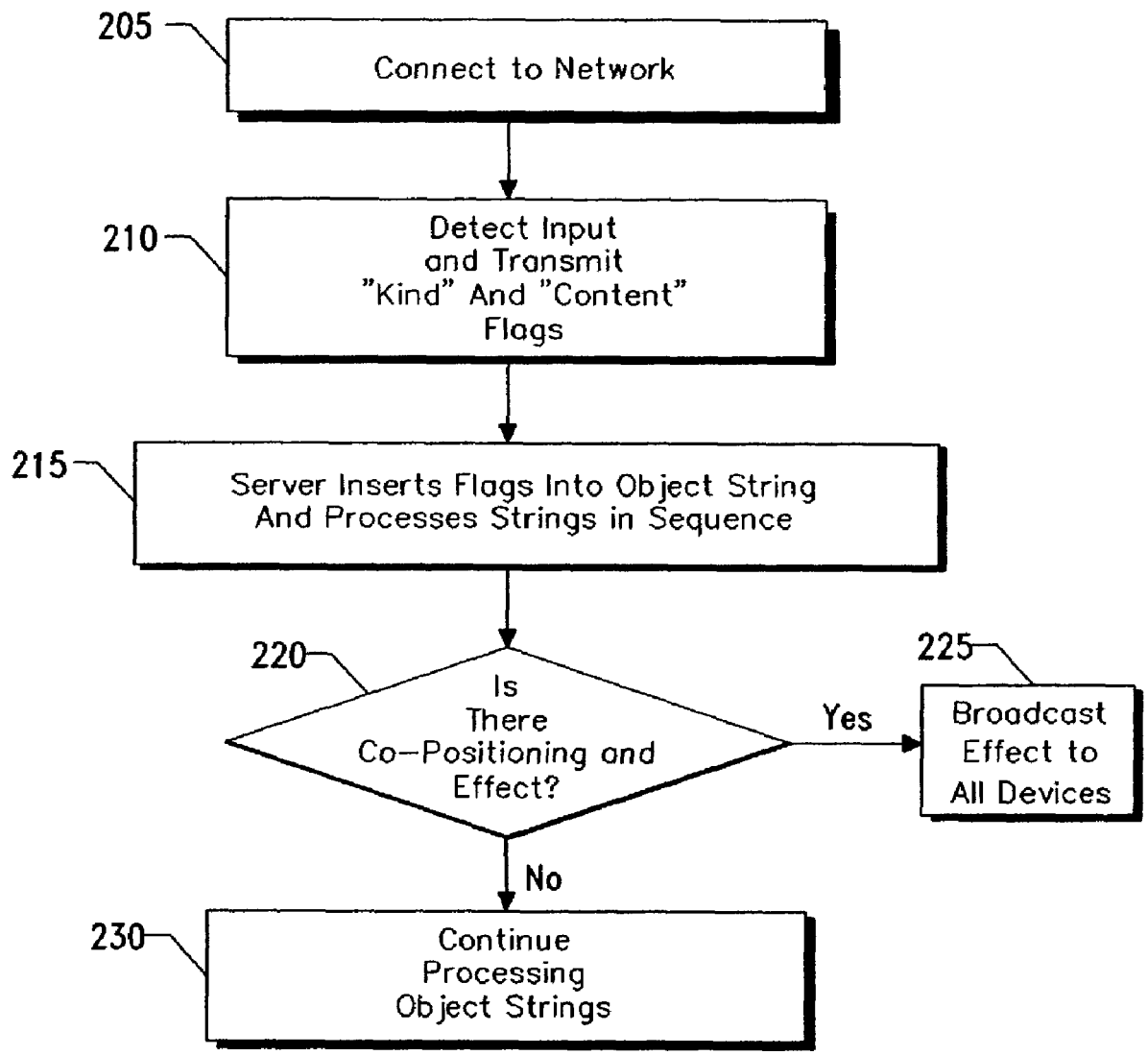
FIG. 2 is an exemplary flow diagram of the operation of the distributed network of devices that can be used to simulate a complex dynamic system of remote nodes.

Thus, the distributed simulation network using the object based parallel modeling language capability of the present invention as depicted in FIG. 1 could be used in any of a variety of settings where complex inputs are collected from remote data entry stations for assimilation and display. One example would be in a classroom environment where the remote devices are calculators used by students to input objection information for a classroom experiment. Another use for the present invention would be in business environments where sales data is collected from remote locations. The present invention can also be beneficially used in business school environments wherein students interact in an environment where marketing or sales related information and rules are input from remote devices operated by students and then assimilated for collective display. An exemplary method in accordance with the present invention is shown in FIG. 2 for a particular object or "node" that is controlled by a particular remote computing device. As shown in FIG. 2, the method of the present invention can be understood as beginning when a remote device connects to the overall network at step 205. When a remote computer device detects some form of input at the device at step 210 (such as numeric keypad entry or other sensory device inputs), the remote device detects the input and then transmits to the network 80 or centralized server 109 a flag indicating the "kind" and "content" of the information that has been detected. It will be appreciated that additional or alternative information can be transmitted upon detection of input at a remote device, such as a time stamp indication or some other programming component characterizing the detected input. In the example discussed herein of a simulation involving the positioning of multiple objects within a given space, the detected input could consist of a position movement indicator (such as an up, down, left or right signal) and/or a rule for controlling the motion of the object (such as an instruction to always move two spaces to the right whenever the object is co-positioned with another object in the physical space). These simplified examples will illustrate the functionality of the present invention to those skilled in the art concerning step 210.

Once the remote device detects and transmits information at step 210 to the centralized network or server, the server will be configured to receive and identify the transmitted information. In a preferred embodiment, the server 109 includes a network interface 110 (FIG. 1), such as the TCP/IP communication protocol commonly used in internet communications. Upon detection of flag information from a remote computing device, the server 109 locates in memory the program string relating to the particular remote device and inserts the transmitted information into the object string for that device at step 215. By maintaining a separate program string for each object that is being simulated in the system, the server 109 can effectively emulate the parallel processing capabilities previously implemented with supercomputer technology wherein a separate processor would be dedicated to each object or node. In contrast, the present invention maintains in memory a string for each object in the system, and then addresses in sequence the object strings to process the information or instructions contained therein, as shown at step 215.

One aspect of processing an object string in accordance with the present invention is to determine whether there is any interplay between a given object or node and any of the other objects or nodes being simulated within the system. In the example discussed herein of a simulation of multiple objects within a given space (for example, a population simulation involving two types of objects where one object (a fox) obliterates a second object (a rabbit) when the two objects are co-positioned), the processing could include a determination of whether there is co-positioning between objects and what effect would result, as shown in FIG. 2 at step 220. In this example, the server would take a string for a particular object, determine its current position information and compare that object's position information with the position information for other objects to determine whether any two objects are co-positioned, and if so what effect, if any, should result. In this example, if two rabbits were co-positioned, there would be no effect, but if a fox and rabbit object were co-positioned, the rabbit object would be obliterated so that only a fox object remained.

Once the centralized simulation server determines for a particular object string that there is an effect that results from a co-positioning at step 220, that effect would be broadcast to all of the remote devices at step 225 to convey information about the result, and then the server would continue to process in sequence the remaining object strings. If however there is no co-positioning effect found at step 220, then the server processor continues processing in sequence the remaining object strings, as shown at step 230 in FIG. 2.

By processing individual object strings in sequence and then broadcasting only the required information to the remote devices, the heavy computational requirements of monitoring the result of multiple, independent objects and their interplay under a given set of rules and strategies are efficiently and centrally implemented using a single server device. As a result, the remote devices can be relatively "thin" and need not individually calculate and correlate the possible effects resulting from changes in object status information. This aspect of the present invention provides a benefit over any system which would distribute the heavy computational requirements to the remote devices, thereby duplicating such software functionality and increasing the complexity of the system simulation to allow for remote correlation of the independent objects and any updates of the status information therefor.

It will be appreciated that the processing aspect of the present invention can encompass any of a variety of computational decisions. For example, each object could have a rule associated with it that results in an effect even when there is no co-positioning. For example, in the population model described herein, if a "fox" object is not co-positioned over a "rabbit" object within a predetermined amount of time, the rule could require that the fox "object" expires. Likewise, if a rabbit object is not co-positioned with a fox object for a predetermined amount of time, or alternatively, if a rabbit is co-positioned with another rabbit object, the rabbit object could duplicate itself, thereby creating another object in the system. With these additional rules, the growth and decline in populations of the respective fox and rabbit objects will proceed and be simulated to demonstrate the interplay between the two types of objects.

Figure 3:
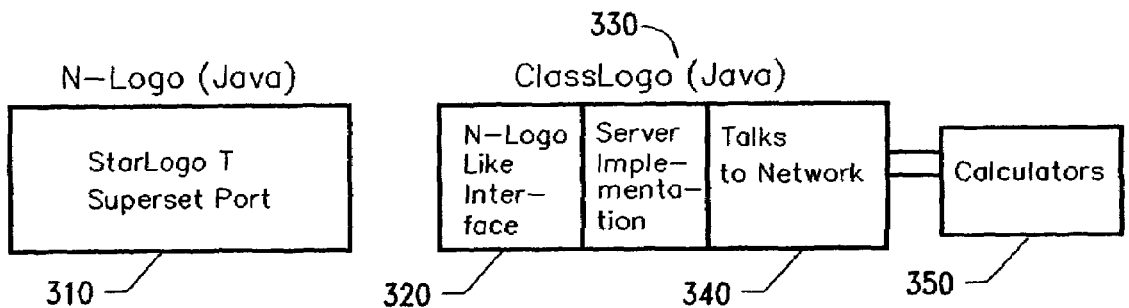
FIG. 3 illustrates an exemplary architecture for networking multiple calculator input devices through a server to emulate a parallel computer network using an object-based modeling functionality in accordance with the present invention.

Shown in FIG. 3 is an alternate embodiment of the present invention wherein multiple calculators 350 are networked together through an interface 340 to a centralized server 330 which allows the individual calculator devices to interact in a centrally coordinated simulation. The server 330 includes an interface 320 for communicating with a modeling language, which in the example shown in FIG. 3 is a java-based modeling language that is implemented as an enhanced port of the StarLogoT language 310, to provide an object-based modeling language. Such a high level modeling language can be used by the individual calculators 350 to provide a real-time dynamically interactive simulation of inputs at the central server 330, thereby allowing the individual calculators to control objects within a complex dynamic system and further allowing the resultant interplay to be centrally coordinated and displayed under control of the central server device. In the embodiment shown in FIG. 3, the centralized server emulates a parallel processing environment by distributing individual object functionality at a high level to the calculator devices 350, but centrally coordinating the processing and interplay between the distributed objects at the server 330.

Figure 4:
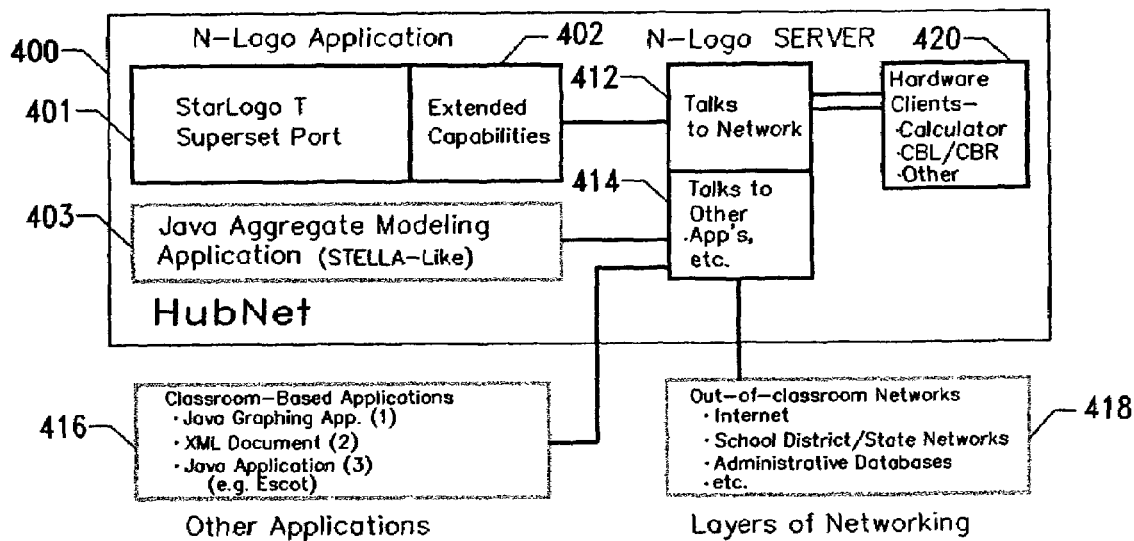
FIG. 4 illustrates an alternate exemplary architecture for networking multiple client input devices through a server to emulate a parallel computer network using an enhanced modeling functionality in accordance with the present invention.

An alternative embodiment of the present invention is illustrated in FIG. 4 as a centralized network 400 herein a plurality of hardware clients 420 are connected to a central server 410 which in turn communicate through an interface 412, 414 to an object based parallel modeling language component 401 and an aggregate modeling language 403. In a selected embodiment, the modeling language components of the server device 410 use an enhanced port of the StarLogoT for the parallel modeling language 401 and use a java-based aggregate modeling language based on the STLLA program for the aggregate model component 403. The parallel and aggregate components 401, 403 provide a powerful modeling language functionality for the server 410 to allow emulation of true parallel computing performance for the distributed hardware clients 420. In addition, the server 410 of the present invention includes an interface 414 for communicating with other applications and networks. For example, additional remote networks for a team, such as the internet, local area networks and remote databases can be connected to the parallel emulation server 410 of the present invention, thereby enabling access to additional resources and/or additional remote devices for participation in the server simulations. In addition, the interface 410 allows the server 410 to access other applications relevant to the simulation of interest, such as classroom-based applications 416. In a selected embodiment, the classroom applications 416 comprise high level programming language applications for efficient interface to the network of hardware clients 420, such as java graphing applications, XML document applications, java applications, and other higher level programming language applications that interface with the world wide web.

In accordance with the embodiment of the present invention depicted in FIG. 4, the plurality of powerful computational tools, including an object based parallel modeling language, an aggregate modeling language and other applications (for example, Model-It, Agentsheets, Cocoa, SWARM) are connected across a central server 410 using server interface functionality which effectively emulates parallel computing approach for managing and networking a plurality of remote hardware client devices 420.

In accordance with the distributed architecture of the present invention, the network can be advantageously used in classroom settings where students can participate as elements in a simulation of a complex dynamic system. Using the open client-server architecture embodiment of the present invention, multiple users at the "Nodes" can control the behavior of individual objects or agents and view the aggregated results on a central computer known as the "Hub." This network of nodes is integrated with a powerful suite of modeling, analysis and display tools that, together, give the capacity to "fly" the system in intuitive mode, to reflect on the emergent result of the simulation and to encode student strategies as rules which the system can then run independently.

In accordance with a selected embodiment of the present invention, a workable minimal subset of functionality is implemented consisting of 1) a suite of networked graphing calculators; 2) a server, which talks to the calculator network and 3) an object-based parallel modeling language, N-Logo, which is an enhanced port of the StarLogoT language that enables users to build object-based models of systems consisting of thousands of distributed elements. The system and method may further integrate aggregate modeling languages, such as STELLA, to thereby facilitate a dialogue between object-based and aggregate approaches. Additional analysis and display tools can be incorporated into the network to allow a much wider array of node hardware including arbitrary Internet hosts.

A potential barrier to wide-spread adoption of networked activities is the difficulties in authoring new PSA. Among other disadvantages associated with conventional solutions, the present invention addresses this problem by use of a Java-based development effort to apply the object-based modeling capabilities to a distributed network of input devices. In a selected embodiment, a Java-based development of the N-Logo modeling language extends the object-based modeling capabilities of StarLogoT by having the N-Logo language also serve as a scripting language for the creation of the networked participatory simulations of the present invention.

Just as object-based models are extensible, the network-based emergent activities created in N-Logo will be extensible. With the present invention, the parallelism of StarLogoT and N-Logo as modeling environments is being significantly extended to also serve as a way of coordinating and authoring activities for a space of networked computing devices (nodes).

In a selected embodiment, the network is designed with the assumption that the nodes have significant resident functionality (at least that of a programmable graphing calculator). The network layer implements flexible communication protocols that include the ability to upload and download data sets, upload and download program (e.g., applets), monitor key-presses at the hand-held level, support real-time interaction as in network computer games, and form collaborative groups of various sizes (e.g., peer to peer, small groups, and whole class modes). In addition, a selected embodiment of the network system of the present invention includes an up-front computer (the "hub") capable of addressing the network of nodes and a display capability (e.g., a projection system) that enables an entire class to view the simulation.

In one embodiment, the network of the present invention includes a suite of networked graphing calculators. The resident functionality of the calculator, including capabilities of interacting with real world devices such as sensors and motors, CBLs and CBRs, allows for a wide range of PSA to be implemented in the classroom. The system can support fully networked modes of interaction with and among learners. While synchronization between the data on the hand-held calculators and the Hub is supported in this model, the model can also support on-going, real-time interactivity and exchange. This fully-networked system is intended to support a range of different topologies for collaboration among learners including point-to-point, small group and whole class interaction. This more inclusive range of interactivity and richly textured forms of collaboration cannot be supported in models based exclusively on the synchronization model of uploading data from after a simulation has been run.

Participatory simulations enabled by the present invention stand to introduce fundamentally new and significant forms of reasoning and insight to school-based curricula. For example, a participatory simulation that is meaningful and where the class as whole has a goal they are aiming to accomplish can help students develop knowledge that is even more situated and embodied than it would be from just being presented with the scenario alone. The students' active engagement in a participatory simulation improves both student motivation and understanding. The sense of ownership is further extended by the fact the students analyze the results they helped to create. A network of handheld devices supports real-time interaction in this simulation. Real-time interaction represents a significant improvement in efficiency and in the range of participatory simulations that can be supported over simply uploading data after a simulation has been completed.

Figure 5A:
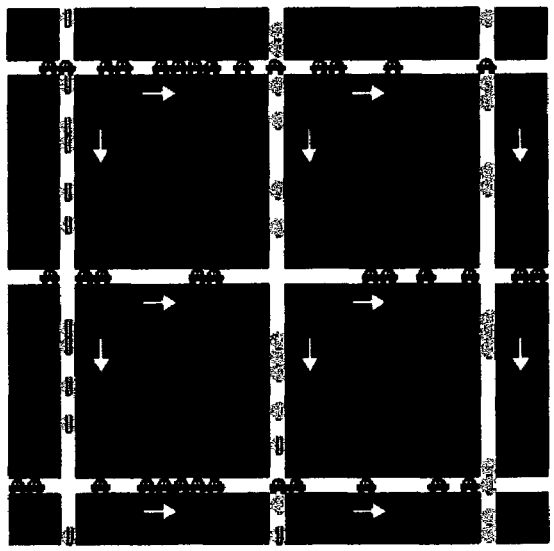
FIG. 5 illustrates a traffic simulation application of the present invention.

As an example of a participatory scenario, the students are instructed that the mayor of the City of Gridlock has commissioned the class to improve the traffic situation in the city. The traffic simulation is projected in front of the class on the central display 101, and begins running with cars heading through the city. The city starts off with no traffic lights, as shown in FIG. 5a. Graphs depicting the average speed of the cars passing through the city and the cars' wait time can also be depicted on the central display 101 (not shown in FIG. 5). On first impressions, it looks like everything is running smoothly for this city. The average velocity is relatively high and the average wait time is close to zero.

Figure 5B:
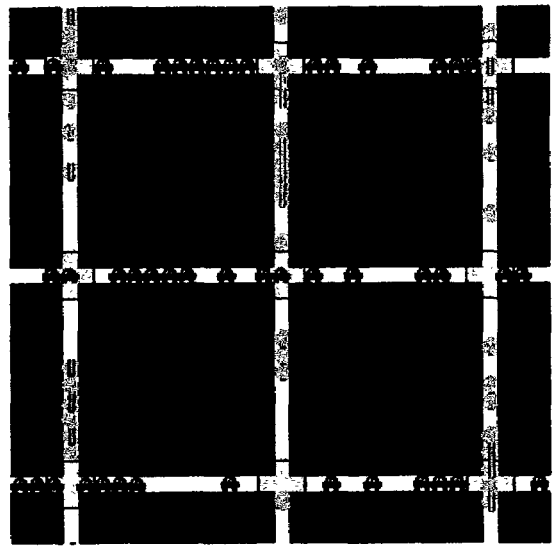
Figure 5C:
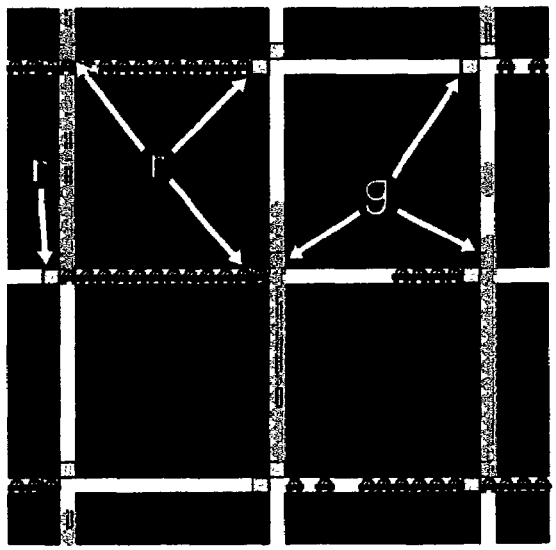

The problem is that the initial simulation doesn't keep track of when cars are occupying the same location on the grid. In real life, two (or more) cars trying to occupy the same location is called a crash. If the simulation at the central display 101 now shows these crashes—denoted with shaded crosses at the intersections—every intersection quickly has a red cross on it, as depicted in FIG. 5b. Traffic comes to a complete standstill. The initial introduction of the participatory simulation is completed by adding a single traffic light at one of the intersections. When the simulation is run again, the teacher can turn the lights at the intersection green (g) and red (r) using a switch on the modeling interface (green in one direction means red in the other). In addition to illustrating the use of the switch, it also soon become apparent that accidents re-emerge at every intersection except the one—the one with the traffic light.

Now traffic lights are placed at every intersection and students can control these lights using the up-arrow keys on their calculators. After each student locates his/her intersection and practices changing the lights, cars are introduced. The good news is that there are no accidents in the City of Gridlock. The bad news is that traffic is backing up all over the city (FIG. 5c), the average speed through the city is low, the average wait time is high, and the Mayor would not be pleased. Students then explore various ways of coordinating their lights. Very subtle questions about logic, timing, phase and synchronization are engaged as students struggle both to create ways of talking about the traffic that are meaningful and to implement strategies making use of this language.

Figure 5D:
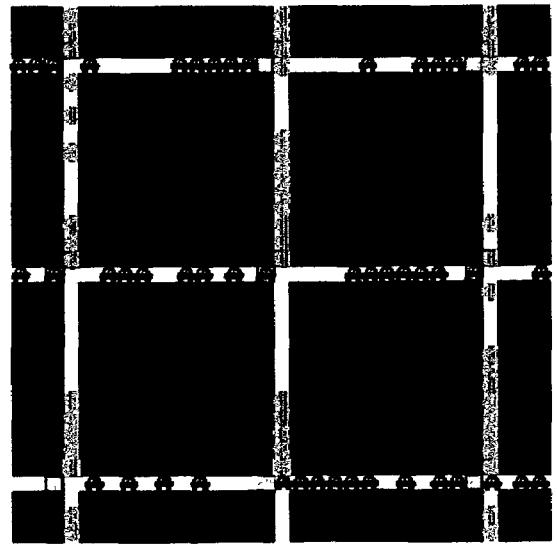

One of the strategies is to synchronize the lights with a phase shift. In FIG. 5d, the lights in the top row turned green in the same direction together, then the lights in the second row waited a few seconds (phase shift) and turned green. This pattern cascades downward as traffic flow in that direction is synchronized. Using the network, data from the various trials can be handed back out to the students. This coordinated approach does improve traffic flow.

One of the benefits of the distributed network of the present invention is that students will actually develop a range of strategies in this participatory simulation. For example, students often develop a "traffic cop" strategy. Each "light" (traffic cop) would look to see in which direction there were more cars and let that direction go. This strategy has significant counter-intuitive consequences. Other students have begun to explore the idea of "smart cars" where accidents might be avoided if the cars had enough built-in intelligence to figure out if a car coming from the side was going to hit it.

The smart car would then take steps to avoid the accident and might be able to do that without having to come to a complete stop (as with a traffic light). As part of preparing a report of recommendations to the mayor of Gridlock, the student strategies need to be analyzed. Using the network, data can be easily collected and exchanged. The present invention readily supports the distributed analyses of these different student strategies.

In a selected embodiment of the present invention, the handheld devices (calculators) have significant resident functionality which provides analytical and comparative functionality. As a result, mathematically meaningful tools are available to every student in the form of graphs, tables, histograms, etc. The flow of information and the location of the tools of analysis do not remain "centralized" in this model, but is instead a multi-directional (student to student, teacher to student, student to teacher, etc.) flow and exchange of analyses. In the traffic example described with reference to FIG. 5, various metrics for measuring the improvement in traffic flow can be developed by students and a set of final recommendations can be developed as a report (or collection of reports) to the mayor. The reports will incorporate elements of both object-based and aggregate analyses. For students, the question of "what is math for" would be answered in a way that is interesting and engaging precisely because participatory simulations are complex. In this way they are more like the highly complex, dynamic world students experience outside of school and outside of traditional math and science education.

In connection with the present invention, a programmable modeling environment is provided for building and exploring multi-level systems. In a selected embodiment, an extended and enhanced port of an "object-based parallel modeling language" (OBPML), such as StarLogoT, is provided as a programmable modeling environment for building and exploring multi-level systems. StarLogoT was developed at the Tufts University Center for Connected Learning and Computer-Based Modeling. It is an extended version (a superset) of StarLogo 2.0.4, which was developed by the Epistemology and Learning Group at the MIT Media Laboratory. With such a modeling component, the behavior of thousands of objects can be controlled in parallel. Each object has its own variables and state. This allows one to model the behavior of distributed and probabilistic systems, often systems that exhibit complex dynamics. With the present invention, a Java implementation of a modeling language is used, and can be run on PCs, Macs, Unix machines and other computing devices.

In accordance with an selected embodiment of the present invention, an extended Java port to StarLogoT is provided as both a programming language for novice programmers and a modeling language for building models of complex systems. By constructing models of the local interactions of many distributed agents, users can explore the global patterns that arise out of these interactions—so-called "emergent phenomena."

In decentralized systems, orderly patterns can arise without centralized control. Increasingly, researchers are choosing decentralized models for the organizations and technologies that they construct in the world, and for the theories that they construct about the world. But many people continue to resist these ideas, assuming centralized control where none exists—for example, assuming (incorrectly) that bird flocks have leaders. The present invention is designed to help students (as well as researchers) develop new ways of thinking about and understanding decentralized systems.

When implemented as an extension of the Logo programming language, the present invention builds upon the features of creating drawings and graphics by giving commands to a graphic "turtle" on the computer screen, and extends these features to allow control of thousands of graphic turtles in parallel. In addition, the turtles' world can be computationally active, in that programs can be created for "patches" that make up the turtles' environment. Turtles and patches can interact with one another—for example, the turtles can be programmed to "sniff" around the world, and change their behaviors based on what they sense in the patches below.

In a selected embodiment, the StarLogoT language is advantageously used as the OBPML component 108 of the present invention. StarLogoT includes three main types of "characters": turtles, patches and observers.

Them Turtles are graphic creatures that can represent almost any type of object: an ant in a colony, a car in a traffic jam, an antibody in an immune system, a molecule in a gas. Each turtle has a position, a heading, a color, and a "pen" for drawing. However, more specialized traits and properties can be added. In accordance with the present invention, the actions and interactions of thousands of turtles can be controlled in parallel.

Patches are pieces of the world in which the turtles live. A patch can be a passive objects upon which the turtles act, but can also be executable commands that act on nearby turtles and patches. In one embodiment, patches are arranged in a grid, similar to cellular automata.

The observer "looks down" on the turtles and patches from a birds-eye perspective. The observer can create new turtles, and it can monitor the activity of the existing turtles and patches.

The modeling component 108 of the present invention allows users to create models of individual elements of a system. As will be appreciated, this component can be implemented with object-based languages, object-based-parallel languages, individual-based languages, embodied languages and agent-based languages. While the description of the embodiment described below refers to the constituents—the turtles, patches, and the observer—as "agents," it will be appreciated that the present invention applies to allow for simulations of complex systems of independent actors, whether described as objects, individuals, embodiments, agents or otherwise.

Figure 6:
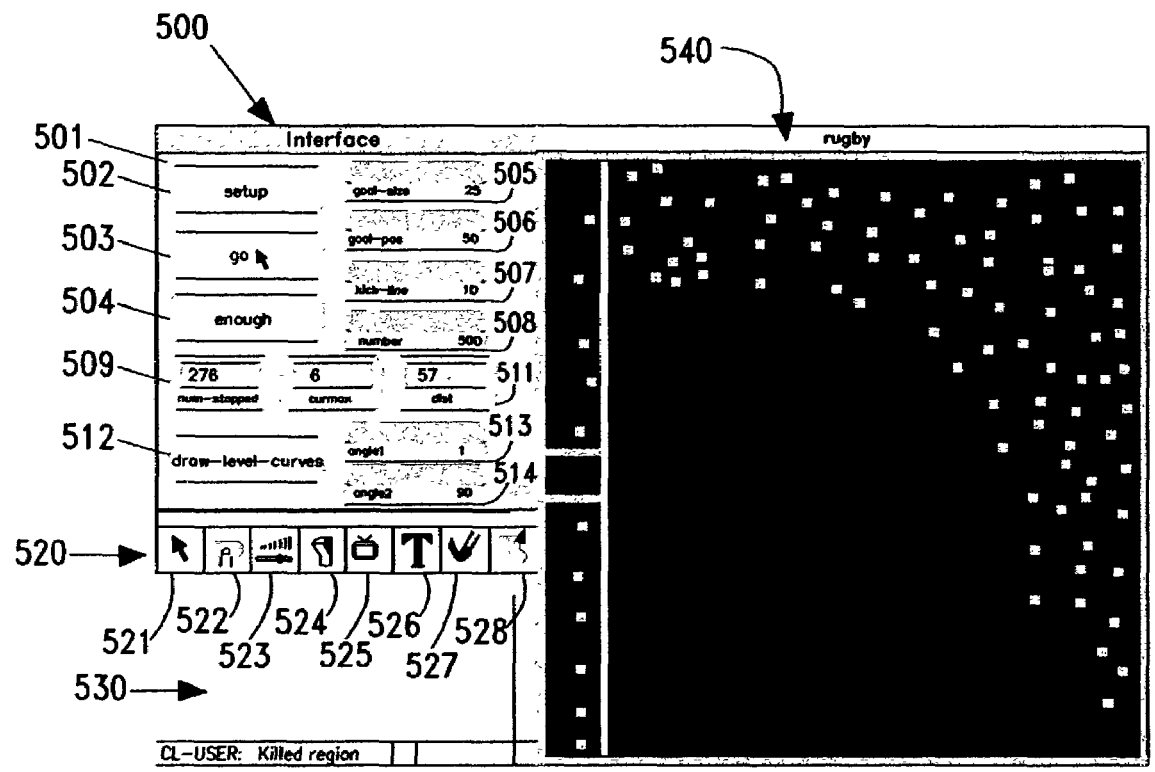
FIG. 6 illustrates an exemplary display device output depicting the results of a participatory simulation embodiment of the present invention.

As shown in the exemplary simulation depiction in FIG. 6, the simulation workspace consists of several windows and toolbars. The main interface window 501 contains buttons, sliders, and monitors that permits direct interaction with StarLogoT programs. The Main Toolbar is used to create and inspect interface objects. The sample interface 501 contains interface elements, including buttons (e.g., 502, 503, 504), sliders (e.g., 505, 506, 507, 508), and monitors (e.g., 509, 510, 511).

The exemplary workspace 500 depicted on the central display 101 may also include a main toolbar 520 which is used to create interface elements. For example, icon 527 is used for selecting the paint pools and icon 528 is used for selecting a shapes palette. A new interface element can be created by clicking on the appropriate tool on the main toolbar 520, and dragging out a rectangle in the interface window 501 to choose a location. For example, a button can be created by clicking on the button icon 522 on the main toolbar 520, and then dragging out a rectangle in the interface window 501. In one embodiment, the button functionality is provided with two modes: once-buttons and forever-buttons. When a once-button is clicked, it executes its instructions once. When a forever-button is clicked, it executes its instructions over and over, until the button is clicked again. Forever-buttons are particularly useful for executing multiple instructions in parallel. As shown in FIG. 6, forever-buttons 503 are identified by a looping pair of arrows on the face of the button, and are sometimes known as "loopers."

The main toolbar 520 may also include variable switches that are set to either 1 or 0. The modeling component permits the creation of a switch by clicking on the toolbar item 524 that looks like a small switch, and then naming the variable that the switch corresponds to.

Textboxes can also be created as part of the modeling component for placement in the interface to explain certain controls. To create a textbox, the text icon 526 on the toolbar is selected, and then the text is entered in the window.

Sliders icons (e.g., 505, 506) are also provided as part of the modeling component functionality to create new global variables. When a slider is created through the modeling component, the modeling program creates a procedure for that slider that reports the value of the slider/variable. Minimum and maximum values of the slider in the dialog box can be selected, as can the current value of the slider. To create a slider as shown in FIG. 6, click on the slider icon 523 on the main toolbar 520, and then drag out a rectangle in the interface window 501.

A further feature optionally provided by the modeling component of the present invention is the monitor icons (e.g., 509, 510, 511). As shown in FIG. 6, monitors are used to display the value of an observer expression. The modeling component permits the creation of a monitor by clicking on the monitor icon 525 in the main toolbar 520, and then dragging out a rectangle in the interface window 501. In the monitor field, any instruction can be entered that returns a value. In a selected embodiment, the monitors are regularly updated every 0.5 seconds.

The exemplary workspace 500 depicted on the central display 101 may also include a graphics window 540 where the simulation is shown. This window is where the StarLogoT turtles move and draw. The turtles move on top of a grid of patches. When a turtle moves off the edge of the screen, it "wraps" around to the other side. A turtle can be moved directly by dragging it with the mouse.

The modeling component may also provide for command entry and execution through a command center input window 530 where commands for StarLogoT are entered and run. In addition, a procedures window is provided for entry of procedures for the turtles, patches, and observer. The procedures window is the main programming console for StarLogoT models.

Figure 7:
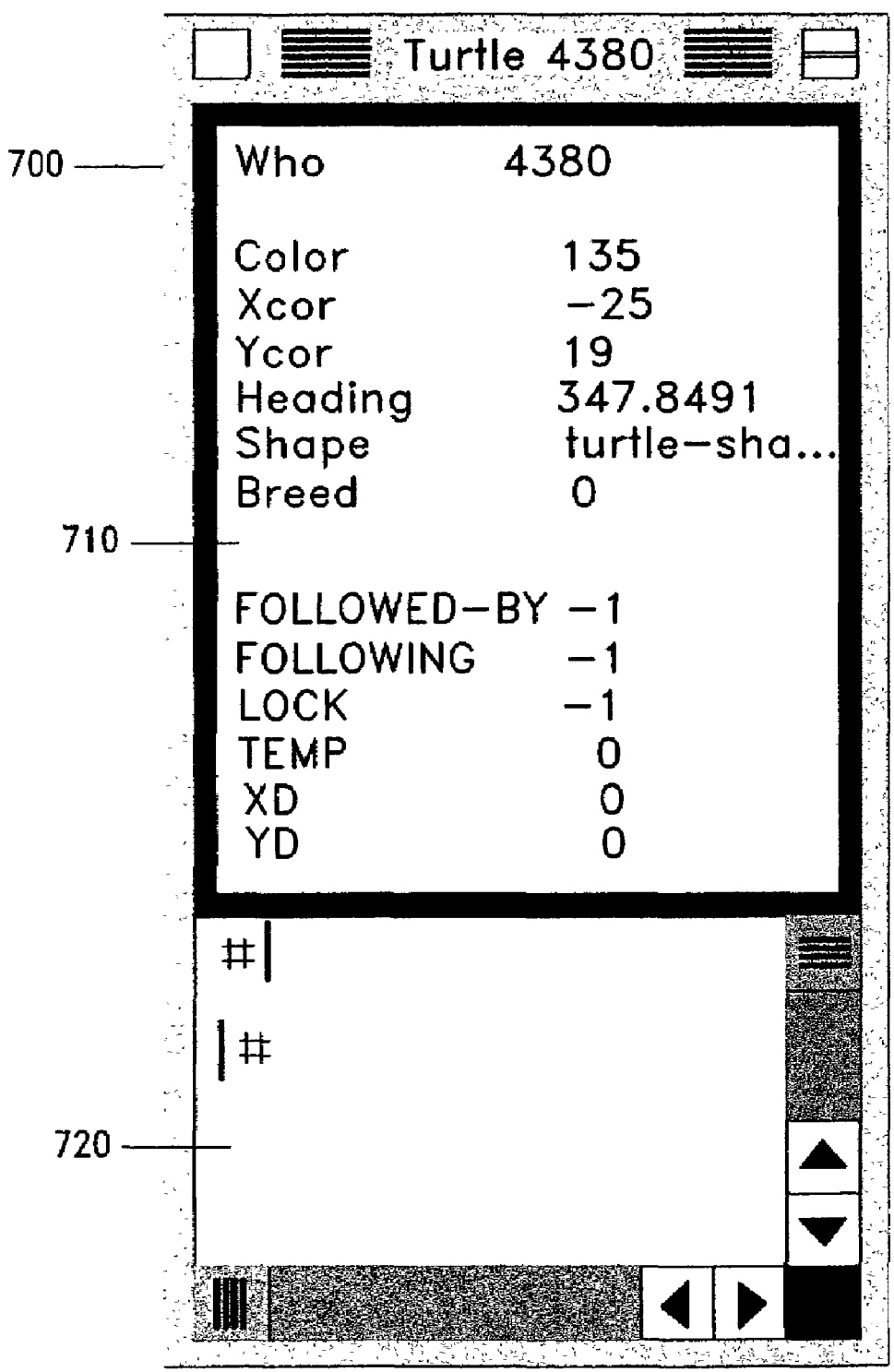
FIG. 7 illustrates an exemplary monitoring feature of the modeling aspect of the present invention.

Upon double-clicking a turtle in the graphics window 540, a turtle monitor 700 will appear as shown in FIG. 7, showing the turtle's state variables (and their values). The lower half of the monitor window is a command center 720, like the above-described command center window 530. However, command center 720 only accepts turtle commands, and it only controls the single turtle that it is monitoring. This feature is extremely useful for debugging turtle behavior.

The turtle monitor 700 shown in FIG. 7 is displaying information about turtle #87. It shows the state variables of the turtle: color, Xcor, Ycor, heading, shape, and breed. The monitor 700 may also show and also shows user-created turtle variables. Turtle monitors may be regularly update while the model program is executing. Values in the turtle monitor 700 can also be directly edited by the user by clicking on a variable value, typing in the new value (or any StarLogo expression), and pressing return (or click out of the box). A similar monitor functionality is provided for path monitors.

While the system and method of the present invention has been described in connection with the preferred embodiment, it is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

What is claimed is:

1. A modeling device for a simulation of complex dynamic systems, comprising:
    a plurality of remote agents, each remote agent comprising:
        logic to receive input data;
        object control node information corresponding to performance of the remote agent and a relationship of the remote agent to the simulation;
        control instructions to convert the input data into the control node information; and
        logic to transmit the object control node information and the control instructions to a server computing device; and
    the server computing device, comprising:
        an object-based parallel modeling language component that collects object control node information and control instructions corresponding to each of the remote agents of the plurality of remote agents and coordinates the interaction of the remote agents based upon the collected object control node information and control instructions;
        processing logic for generating interactive simulation information based upon the interaction of the remote agents by processing a string corresponding to each of the remote agents to identify first or second co-positioning effects, where the first co-positioning effect deletes a first object associated with a first remote agent if the first object is not co-positioned with another object within a predetermined amount of time, and where the second co-positioning effect duplicates a second object associated with a second remote agent if the second object is co-positioned with another object;
        logic to transmit interactive simulation information to the plurality of remote agents; and
        a central control panel comprising a graphical display for viewing the simulation information.

2. The modeling device of claim 1, the server computing device further comprising:
    modeling tools;
    analysis tools; and
    display tools for displaying the interactive simulation information on a centrally located display at the server computing device.

3. The modeling device of claim 1, wherein the interactive simulation information is transmitted to a particular remote agent only if the simulation information of the particular remote agent is impacted by control node information and control instructions of a second remote agent.

4. The modeling device of claim 1, wherein the input information comprises:
    input data; and
    control instructions corresponding to the remote agent.

5. The modeling device of claim 1, wherein the graphical display also displays input information and status data for a selected remote agent of the plurality of remote agents.

6. The modeling device of claim 1, the central control panel further comprising:
    a plurality of user input devices for providing direct interaction with the object-based parallel modeling language component by enabling a user to input information and control instructions, both corresponding to a selected remote device.

7. A method of producing a coordinated and interactive simulation of a dynamic system, comprising the steps of:
    defining a set of remote agents, wherein each remote agent performs the steps of:
        receiving input data; and
        transmitting the input data and control instructions relating to a corresponding remote agent of the set of remote agents to a server computing device;
    collecting the input data and control instructions from each of the remote agents of the plurality of remote agents at the server computing device;
    coordinating the interaction of the remote agents at the server computing device to generate interactive simulation information based upon the input data and the control instructions from each remote agent by processing a string of input data and control instructions corresponding to each of the remote agents to identify first or second co-positioning effects, where the first co-positioning effect deletes a first object associated with a first remote agent if the first object is not co-positioned with another object within a predetermined amount of time, and where the second co-positioning effect duplicates a second object associated with a second remote agent if the second object is co-positioned with another object; and
    transmitting interactive simulation information based upon the coordination of the interaction of the remote agents from the server computing device to the plurality of remote agents.

8. The simulation method of claim 7, the simulating step comprising the steps of:
    analyzing the input data corresponding to a particular remote agent based upon control instructions corresponding to the particular remote agent;
    modeling the interactive simulation information based upon an interaction between the analyzed input data from the remote agents; and
    displaying a simulation based upon the interactive simulation information.

9. The simulation method of claim 7, wherein the interactive simulation information is transmitted to a particular remote agent only if the simulation information for the particular remote agent is impacted by control node information and control instructions of a second remote agent.

10. The simulation method of claim 7, further comprising the step of:

defining sets of control instructions, each set of control instructions corresponding to a remote agent of the plurality of remote agents; and input to each particular remote agent the set of control instructions corresponding to the particular remote agent.

11. The simulation method of claim 7, further comprising the step of:

displaying on a central control panel coupled to the server computing device a graphical display of the interactive simulation information.

12. The simulation method of claim 11, further comprising the step of:

displaying on the central control panel input information and status data for a selected remote agent of the plurality of remote agents.

13. The simulation method of claim 11, further comprising the step of:

entering input information and control instructions, both corresponding to a selected remote device, at the server computing device.

* * * * *